US012796398B2

(12) United States Patent
Hong et al.

(10) Patent No.: US 12,796,398 B2
(45) Date of Patent: Nov. 10, 2026

(54) SUBSTRATE BONDING APPARATUS

(71) Applicant: SAMSUNG ELECTRONICS CO., LTD., Suwon-si (KR)

(72) Inventors: Jaeho Hong, Suwon-si (KR); Bongcheol Kim, Suwon-si (KR); Taehong Min, Suwon-si (KR); Sangjun Park, Suwon-si (KR); Sang-ho Yun, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/819,301

(22) Filed: Aug. 29, 2024

(65) Prior Publication Data

US 2025/0308978 A1 Oct. 2, 2025

(30) Foreign Application Priority Data

Mar. 28, 2024 (KR) ........................ 10-2024-0042692

(51) Int. Cl.

*H01L 21/687* (2006.01)
*H10P 72/76* (2026.01)
*H10W 72/00* (2026.01)

(52) U.S. Cl.

CPC ....... *H10P 72/7624* (2026.01); *H10W 72/071* (2026.01)

(58) Field of Classification Search

CPC . H01L 21/68785; H01L 24/74; H01L 224/74; H01L 21/67092; H01L 21/6838
See application file for complete search history.

(56) References Cited

U.S. PATENT DOCUMENTS

| | | | | |
|---|---|---|---|---|
| 10,109,487 | B2 | 10/2018 | Kurz et al. | |
| 10,504,730 | B2 | 12/2019 | Kurz et al. | |
| 10,636,662 | B2 | 4/2020 | Kurz et al. | |
| 10,720,345 | B1 | 7/2020 | Kobrinsky et al. | |
| 10,748,770 | B2 | 8/2020 | Kurz et al. | |
| 10,861,699 | B2 | 12/2020 | Kurz et al. | |
| 11,251,045 | B2 | 2/2022 | Kurz et al. | |
| 11,527,410 | B2 | 12/2022 | Kurz et al. | |
| 2009/0096275 | A1* | 4/2009 | Nelson | B28D 1/26 299/102 |
| 2021/0057263 | A1* | 2/2021 | Kim | H01L 21/6838 |
| 2021/0242044 | A1 | 8/2021 | Mitsuishi et al. | |

(Continued)

FOREIGN PATENT DOCUMENTS

| | | | | |
|---|---|---|---|---|
| CN | 113299544 A | 8/2021 | | |
| JP | 6448858 B2 | 1/2019 | | |
| KR | 20160148477 A | * 12/2016 | | H01L 21/6838 |

(Continued)

*Primary Examiner* — Daniel McNally
(74) *Attorney, Agent, or Firm* — Sughrue Mion, PLLC

(57) ABSTRACT

Provided is a substrate bonding apparatus including: an upper chuck including a guide hole extending in a vertical direction; a lower chuck below the upper chuck, wherein the upper chuck and the lower chuck are configured to have a plurality of overlapped substrates placed between the upper chuck and the lower chuck; a striking pin configured to be driven within the guide hole and to strike the plurality of overlapped substrates; and a buffer member below the lower chuck, wherein the buffer member is configured to buffer a striking force transmitted by the striking pin.

20 Claims, 5 Drawing Sheets

(56) References Cited

U.S. PATENT DOCUMENTS

| | | | | |
|---|---|---|---|---|
| 2022/0076980 | A1* | 3/2022 | Kawadahara | H01L 24/744 |
| 2023/0238268 | A1 | 7/2023 | Huang et al. | |

FOREIGN PATENT DOCUMENTS

| | | | |
|---|---|---|---|
| KR | 10-2017-0121909 | A | 11/2017 |
| KR | 10-1840902 | B1 | 3/2018 |
| KR | 10-2021-0055083 | A | 5/2021 |
| KR | 10-2023-0060947 | A | 5/2023 |
| KR | 10-2023-0133405 | A | 9/2023 |

* cited by examiner

SUBSTRATE BONDING APPARATUS

CROSS-REFERENCE TO RELATED APPLICATION

This application claims priority to Korean Patent Application No. 10-2024-0042692, filed in the Korean Intellectual Property Office on Mar. 28, 2024, the entire contents of which are incorporated herein by reference.

BACKGROUND

1. Field

The present disclosure relates to a substrate bonding apparatus.

2. Description of Related Art

A 3D DRAM (Three-Dimensional Dynamic Random Access Memory) is being developed as a type of dynamic random access memory that uses a three-dimensional structure instead of the typical two-dimensional memory structure. A 3D DRAM generally has a structure wherein multiple layers of memory cells are stacked together, and each layer can transmit data and signals through passages connecting the layers with each another. This allows 3D DRAM to store more data and provide faster access speeds.

In the 3D DRAM manufacturing process, a bonding process that bonds a wafer to other wafers is performed. In the bonding process, it is necessary to finely control bonder equipment to perform bonding between wafers in order to secure a stable yield. However, if wafer distortion occurs during wafer bonding in bonder equipment, it may cause misalignment between layers in the 3D DRAM chips. There is a need to control wafer distortion after bonding, otherwise interlayer misalignment will remain and thus reduce semiconductor yield.

SUMMARY

Provided is a substrate bonding apparatus configured to alleviate distortion of the substrate in the substrate bonding process by introducing a buffer member to absorb the striking force.

According to an aspect of the disclosure, a substrate bonding apparatus includes: an upper chuck including a guide hole extending in a vertical direction; a lower chuck below the upper chuck, wherein the upper chuck and the lower chuck are configured to have a plurality of overlapped substrates placed between the upper chuck and the lower chuck; a striking pin configured to be driven within the guide hole and to strike the plurality of overlapped substrates; and a buffer member below the lower chuck, wherein the buffer member is configured to buffer a striking force transmitted by the striking pin.

According to an aspect of the disclosure, a substrate bonding apparatus includes: an upper chuck and a lower chuck facing each other and configured to have a plurality of overlapped substrates to be disposed therebetween; a striking pin configured to be driven within a guide hole penetrating the upper chuck and to strike the plurality of overlapped substrates; a stage upon which the lower chuck is placed; and a buffer member between the lower chuck and the stage, wherein the buffer member includes a polymer material.

According to an aspect of the disclosure, a substrate bonding apparatus includes: an upper chuck including: a guide hole extending through the upper chuck in a vertical direction; and an upper suction hole extending through the upper chuck; a lower chuck below the upper chuck, the lower chuck including: a lower suction hole extending through the lower chuck; a striking pin configured to be driven within the guide hole; and a buffer member below the lower chuck, wherein the upper chuck and the lower chuck are configured to have a plurality of overlapped substrates placed therebetween, wherein the upper suction hole and the lower suction hole are configured to apply suction to the plurality of overlapped substrates, wherein the striking pin is configured to strike the plurality of overlapped substrates, and wherein the buffer member is configured to buffer a striking force transmitted by the striking pin.

BRIEF DESCRIPTION OF DRAWINGS

The above and other aspects and features of certain embodiments of the present disclosure will be more apparent from the following description taken in conjunction with the accompanying drawings, in which.

DETAILED DESCRIPTION

Figure 1:
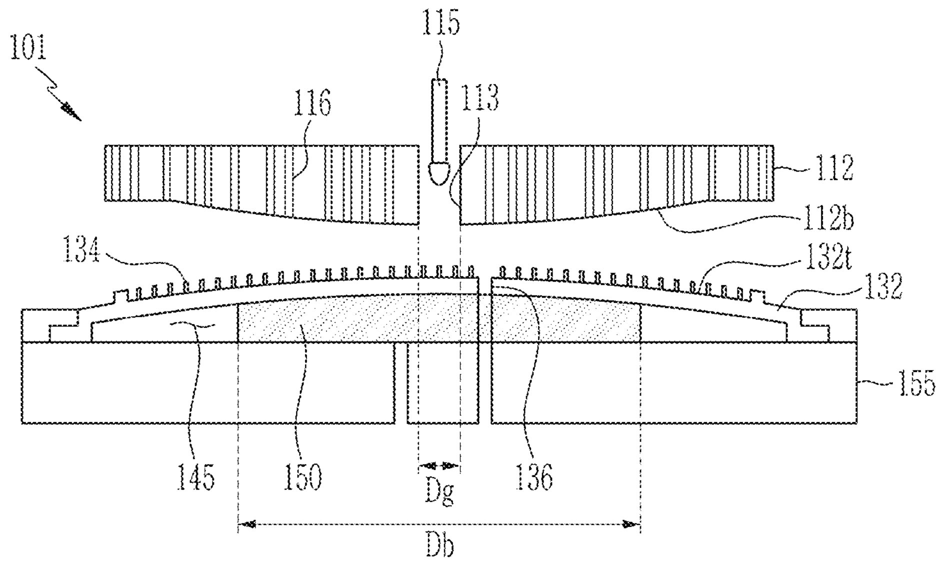
FIG. 1 is a front, cross-sectional view schematically illustrating a substrate bonding apparatus according to an embodiment.

Hereinafter, with reference to accompanying drawings, various embodiments of the present disclosure will be described in detail so that a person of an ordinary skill may implement the present disclosure. The present disclosure may be implemented in many different forms and is not limited to the embodiments described herein.

In order to clearly explain the present disclosure, parts that are not relevant to the description are omitted, and identical or similar components are assigned the same reference numerals throughout the specification.

In addition, the size and thickness of each component shown in the drawings are shown arbitrarily for convenience of explanation, so the present disclosure is not necessarily limited to what is shown. In the drawings, the thickness of layers, films, panels, regions, etc., are exaggerated for clarity. And in the drawings, for convenience of explanation, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, being "on" or "above" a reference element means being positioned on or below the reference element, and does not necessarily mean being positioned "above" or "on" in a direction opposite to gravity.

In addition, unless explicitly described to the contrary, the word "comprise", and variations such as "comprises" or "comprising", will be understood to imply the inclusion of stated elements but not the exclusion of any other elements.

As used herein, the expressions "at least one of a, b or c" and "at least one of a, b and c" indicate "only a," "only b," "only c," "both a and b," "both a and c," "both b and c," and "all of a, b, and c."

It will be understood that, although the terms "first", "second", "third", etc., may be used herein to describe various elements, is the disclosure should not be limited by these terms. These terms are only used to distinguish one element from another element.

As used herein, the singular forms "a," "an" and "the" are intended to include the plural forms as well, unless the context clearly indicates otherwise.

With regard to any method or process described herein, an identification code may be used for the convenience of the description but is not intended to illustrate the order of each step or operation. Each step or operation may be implemented in an order different from the illustrated order unless the context clearly indicates otherwise. One or more steps or operations may be omitted unless the context of the disclosure clearly indicates otherwise.

In addition, throughout the specification, when referring to "a plane view", it means that the target portion is viewed from above, and when referring to "a cross-section view", it means that a cross section of the target portion cut vertically is viewed from a side.

FIG. 1 is a cross-sectional view schematically illustrating a substrate bonding apparatus according to an embodiment.

Referring to FIG. 1, the substrate bonding apparatus 101 according to an embodiment includes an upper chuck 112 and a lower chuck 132 facing each other and arranged vertically. A plurality of substrates 61 and 62 (see FIG. 3) may be arranged in an overlapping state between the upper chuck 112 and the lower chuck 132 for preparation of bonding. A guide hole 113 extending in a vertical direction is formed in the upper chuck 112, and a striking pin 115 may be provided to be driven up and down along the guide hole 113. The striking pin 115 may be driven up and down to strike the plurality of the overlapped substrates 61 and 62. The plurality of substrates 61 and 62 may be bonded to each other due to the energy generated by the striking force applied by the striking pin 115. The striking force of the striking pin 115 is transmitted to the center of the substrates 61 and 62, and bonding of the two substrates 61 and 62 is initiated. Bonding between the substrates 61 and 62 progresses by symmetric propagation from the center to the edges of the substrates 61 and 62, and through this process, substrate bonding progresses. Here, the plurality of substrates 61 and 62 may be a plurality of wafers, but the disclosure is not limited thereto.

In an embodiment, the upper chuck 112 may include a downwardly convex portion, and the lower chuck 132 may include an upwardly convex portion. The lower surface 112*b* of the upper chuck 112 may be convex downward, and the upper surface 132*t* of the lower chuck 132 may be convex upward. Also, the downwardly convex portion of the upper chuck 112 may be formed such that a center portion is thicker in a vertical direction than an edge portion, where the "center" and "edge" are relative to a horizontal direction.

The lower surface 112*b* of the upper chuck 112 and the upper surface 132*t* of the lower chuck 132 face each other, and a plurality of overlapped substrates 61 and 62 may be disposed between them. The lower surface 112*b* of the upper chuck 112 may at least partially contact the upper surfaces of the plurality of overlapped substrates 61 and 62, and the upper surface 132*t* of the lower chuck 132 may at least partially contact a lower surfaces of the plurality of overlapped substrates 61 and 62.

The upper chuck 112 may have an upper suction hole 116 penetrating the body to be extended. A plurality of upper suction holes 116 may be provided and may be opened at the lower surface 112*b* of the upper chuck 112. The lower chuck 132 may have a lower suction hole 136 penetrating the body to be extended. At least one lower suction hole 136 may be provided and may be opened at the upper surface 132*t* of the lower chuck 132.

The upper suction hole 116 and the lower suction hole 136 respectively may be connected to a vacuum pump separately provided, and may provide a suction function. The upper suction hole 116 and lower suction hole 136 may perform a function of fixing the substrates 61 and 62 disposed between the upper chuck 112 and the lower chuck 132 so that they do not move.

The guide hole 113 may be disposed at the horizontal center of the upper chuck 112 and penetrate the body of the upper chuck 112 vertically. Since the upper chuck 112 includes a downwardly convex portion, the guide hole 113 may be formed to penetrate the downwardly convex portion. Therefore, the striking pin 115 driven along the guide hole 113 may strike the planar center portion of the overlapped substrates 61 and 62 disposed below the upper chuck 112.

The lower chuck 132 may be provided with a support pin 134 on its upper surface 132*t*. The support pin 134 may include a plurality of support pins 134 and may be distributed over an entire upper surface 132*t* of the lower chuck 132. The support pins 134 may contact and support the substrates 61 and 62 positioned on the upper surface 132*t* of the lower chuck 132.

In an embodiment, a buffer member 150 may be disposed below the lower chuck 132. The buffer member 150 may be configured to buffer the striking force transmitted by the striking pin 115 The buffer member 150 may contact and support the lower chuck 132. Since the lower chuck 132 has the upwardly convex portion and a concave space 145 is formed below the upwardly convex portion, the buffer member 150 may be disposed to contact the lower chuck 132 in the concave space 145.

The substrate bonding apparatus 101 according to the present disclosure may include a stage 155 where the lower chuck 132 is placed. The buffer member 150 may be disposed between the lower chuck 132 and the stage 155. That is, the buffer member 150 may be fixed by contacting the lower chuck 132 on an upper surface of the buffer member 150 and contacting the stage 155 on a lower surface of the buffer member 150.

Figure 3:
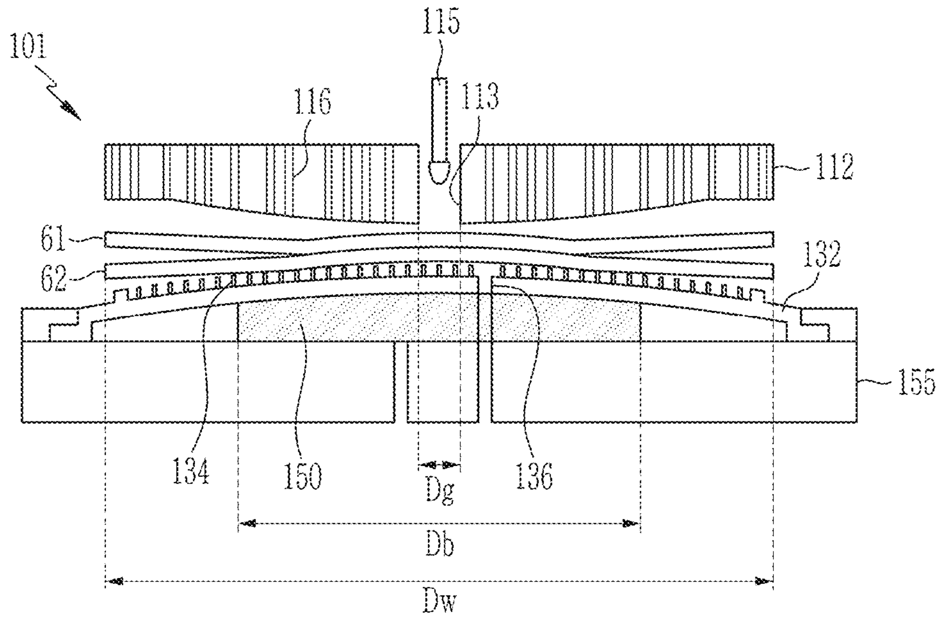
FIGS. 3, 4 and 5 are front, cross-sectional views schematically illustrating the operation of the substrate bonding apparatus according to the embodiment of FIG. 1.

The diameter Db of the buffer member 150 in the horizontal direction may be greater than the diameter Dg of the guide hole 113 and smaller than the diameter Dw of the substrates 61 and 62 (see FIG. 3). Since the buffer member 150 is provided to absorb the striking force of the striking pin 115, it may be disposed at the center portion of the substrate bonding apparatus 101 where the striking force of the striking pin 115 is concentrated. Therefore, the buffer member 150 may have a diameter Db greater than the diameter Dg of the guide hole 113 by which the striking pin 115 is guided. Since the edge portions of the substrates 61 and 62 have relatively little need for such absorption, the desired effect can be expected even if it is smaller than the diameter Dw of the substrates 61 and 62. However, the scope of the present disclosure is not limited thereto. For example, the diameter Db of the buffer member 150 in the horizontal direction may be in a range from 80 mm to 100 mm. If the diameter of the buffer member 150 is smaller than 80 mm, it may not be able to sufficiently absorb the striking force, and if it is larger than 100 mm, it may result in unnecessary waste of materials of the buffer member 150.

The buffer member 150 may include a viscoelastic material, and the viscoelasticity may be in the range of 10 Pa·s or more and $10^8$ Pa·s or less. The buffer member 150 may include a polymer material among materials having viscoelasticity, and may include any one of polyacrylamide, polyurethane, and polyimide (PI). In an embodiment, the buffer member 150 may include polyurethane.

Figure 2:
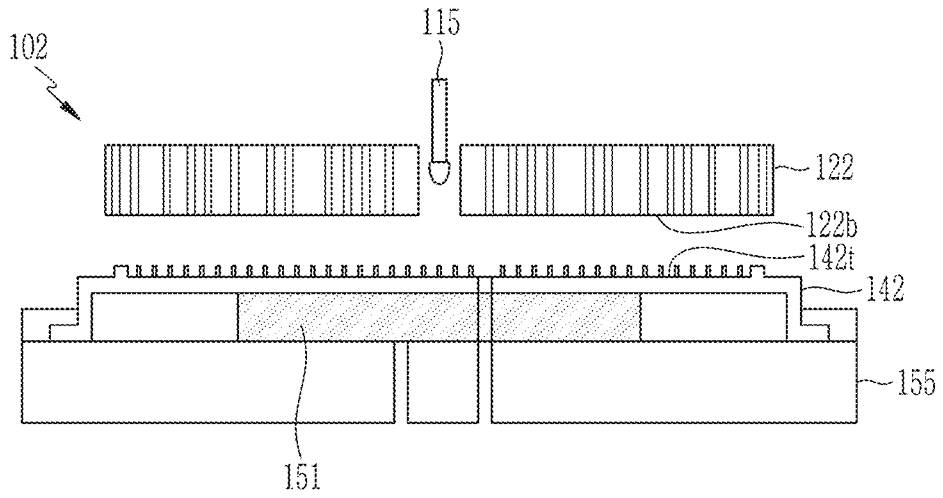
FIG. 2 is a front, cross-sectional view schematically illustrating a substrate bonding apparatus according to another embodiment.

FIG. 2 is a front, cross-sectional view schematically illustrating a substrate bonding apparatus according to another embodiment.

Referring to FIG. 2, the substrate bonding apparatus 102 according to the present embodiment may include an upper chuck 122 and a lower chuck 142 facing each other and arranged vertically, and the upper chuck 122 and the lower chuck 142 may have a flat lower surface 122*b* and a flat upper surface 142*t*, respectively. The lower surface 122*b* of the upper chuck 122 and the upper surface 142*t* of the lower chuck 142 face each other, and a plurality of overlapped substrates 61 and 62 may be disposed therebetween. The lower surface 122*b* of the upper chuck 122 may contact upper surfaces of the plurality of overlapped substrates 61 and 62, and the upper surface 142*t* of the lower chuck 142 may contact lower surfaces of the plurality of overlapped substrates 61, 62.

A buffer member 151 may be disposed below a flat lower portion of the lower chuck 142.

The buffer member 151 may contact and support the lower chuck 142. The substrate bonding apparatus 102 may include a stage 155 where the lower chuck 142 is placed, and the buffer member 151 may be disposed between the lower chuck 142 and the stage 155. In other words, the buffer member 151 may be fixed by contacting the lower chuck 142 on an upper surface of the buffer member 151 and contacting the stage 155 on a lower surface of the buffer member 151.

The buffer member 151 may include a viscoelastic material, and the viscoelasticity may be in a range from 10 Pa·s to $10^8$ Pa·s. The buffer member 151 may include a polymer material among materials having viscoelasticity, and may include any one of polyacrylamide, polyurethane, and polyimide (PI). In an embodiment, the buffer member 151 may include polyurethane.

Since the other configurations are the same as those of the substrate bonding apparatus 101 according to the embodiment described with reference to FIG. 1, duplicate descriptions will be omitted.

Figure 4:
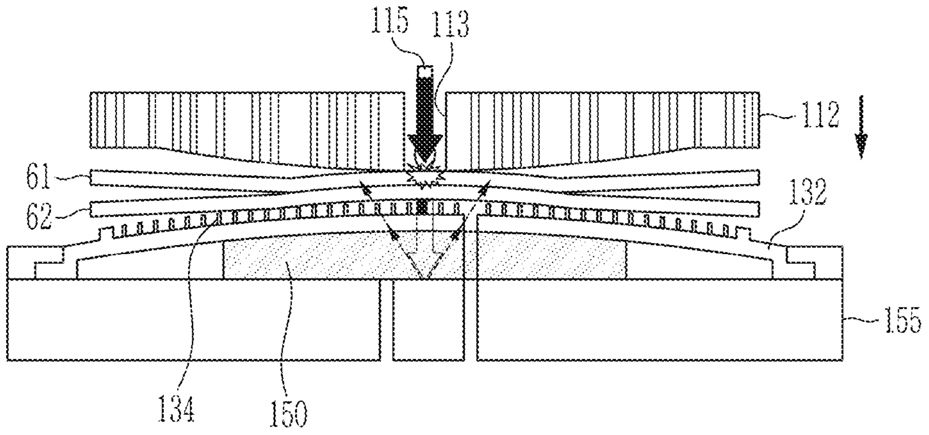
Figure 5:
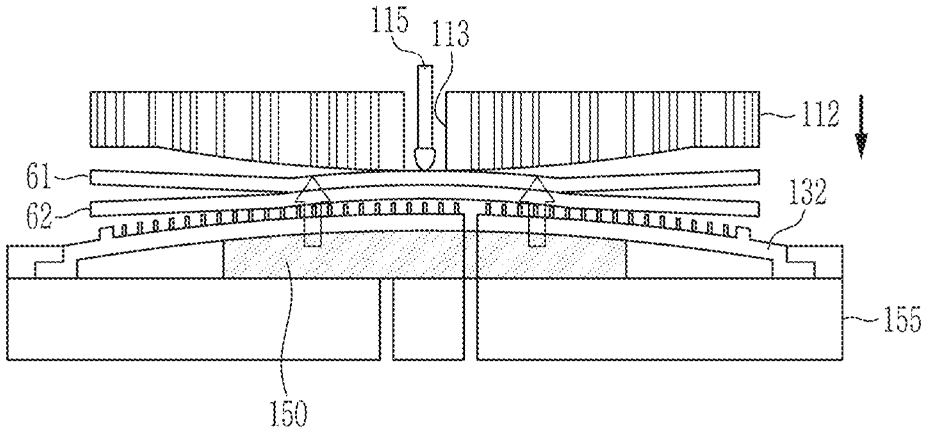

FIGS. 3 to 5 are front, cross-sectional views schematically illustrating the operation of the substrate bonding apparatus according to the embodiment of FIG. 1.

Referring to FIG. 3, in the substrate bonding apparatus 101, a pair of overlapped substrates 61 and 62 are disposed between the upper chuck 112 and the lower chuck 132. And the upper chuck 112 and lower chuck 132 are aligned with each other. The support pins 134 of the lower chuck 132 contact and support lower surfaces of the overlapped substrates 61 and 62. The overlapped substrates 61 and 62 may be fixed on the lower chuck 132 by performing a suction function through the lower suction hole 136 formed in the lower chuck 132.

The upper chuck 112 may contact the upper surfaces of the overlapped substrates 61 and 62 on top of the substrates 61 and 62. The upper chuck 112 may be fixed on the overlapped substrates 61 and 62 by performing a suction function through the upper suction hole 116 formed in the upper chuck 112. The striking pin 115 may be positioned on an entrance side of the guide hole 113 formed in the upper chuck 112 before starting moving within the guide hole 113.

Referring to FIGS. 4 and 5, when the overlapped substrates 61 and 62 between the upper chuck 112 and the lower chuck 132 are fixed, the striking pin 115 is driven to move along the guide hole 113. Driving of the striking pin 115 may be performed by a separately configured striking pin driving unit. For example, the striking pin 115 may be driven by controlling vacuum of a vacuum pump connected to the guide hole 113 and the striking pin 115. As the striking pin 115 moves to be displaced toward an exit side of the guide hole 113, an end of the striking pin 115 strikes the center portion, which contacts the upper chuck 112, of the overlapped substrates 61 and 62. By strikes of the striking pin 115, the striking force is transmitted to the overlapped substrates 61 and 62, and the energy generated thereby allows the overlapped substrates 61 and 62 to be bonded to each other.

In this process, the lower chuck 132 may apply a reaction force from below the overlapped substrates 61 and 62 as a reaction to the action of the striking force. However, the buffer member 150 is disposed below and in contact with the lower chuck 132 to disperse and absorb the striking force. The distributed striking force can reduce its level when the substrates 61 and 62 and the lower chuck 132 produce an action-reaction effect. That is, the buffer member 150 made of a viscoelastic polymer material may absorb an impact of the striking force caused by the striking pin 115 to reduce the reaction force caused by the lower chuck 132.

As a result, substrate distortion can be alleviated and the interlayer alignment of the substrates can be correctly aligned. When using a wafer as a substrate, a wafer with correct interlayer alignment is obtained, thereby stable operation of 3D DRAM and increase of yield can be achieved.

Figure 6:
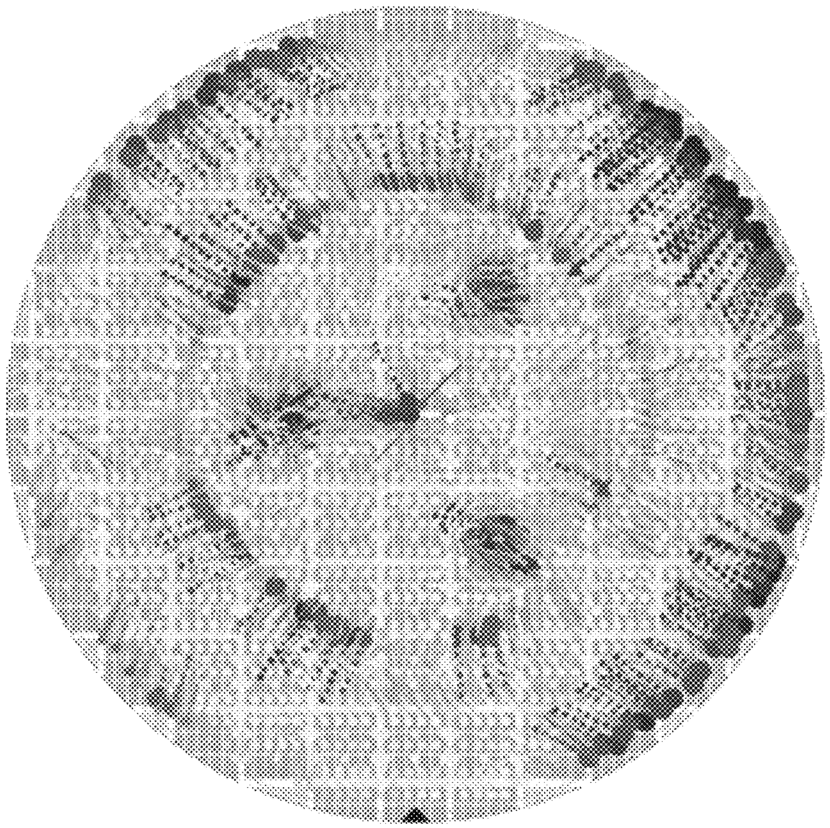
FIG. 6 is a diagram illustrating an overlay performance resulting from bonding wafers using a substrate bonding apparatus according to a comparative example.
Figure 7:
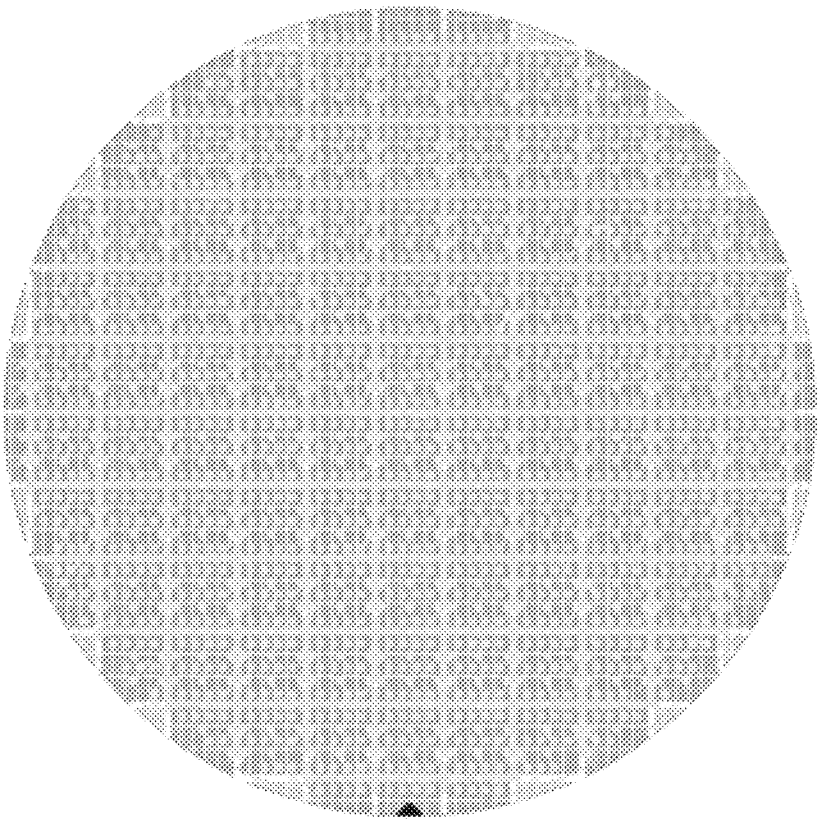
FIG. 7 is a diagram illustrating the overlay performance resulting from bonding wafers using a substrate bonding apparatus according to an embodiment.

FIG. 6 is a diagram illustrating an overlay performance resulting from bonding a wafer using a substrate bonding apparatus according to a comparative example, and FIG. 7 is a diagram illustrating the overlay performance resulting from bonding a wafer using a substrate bonding apparatus according to an embodiment of the present disclosure.

In the substrate bonding apparatus according to the comparative example, the buffer member 151 is not disposed below the lower chuck 132. Accordingly, an empty space is formed between the lower chuck 132 and the stage 155. Striking the substrates overlapped between the upper chuck 112 and the lower chuck 132 with a striking pin for substrate bonding generates a striking force. This striking force passes through the center bonding portion of the overlapped substrates to be applied to the lower chuck 132 and to cause an action-reaction phenomenon. Since there is no member serving as a buffer or damping under the lower chuck 132, the striking force can be thoroughly applied to the substrates by action-reaction without resistance. And, the reaction to striking force as applied to the substrates may subsequently cause substrate distortion, and may result in overlay deterioration and, ultimately, lower yield.

FIGS. 6 and 7 are images shaded according to the degree to which vector values are distorted based on key positions in wafers bonded together using an overlay facility. FIG. 6 shows a result of bonding a wafer using a substrate bonding apparatus according to a comparative example, and it can be seen that distortions having a shape of concentric circles occurred in multiple regions inside the wafers. FIG. 7 shows a result of bonding a wafer using the substrate bonding apparatus 101 according to the embodiment, and it can be seen that no distortion occurred inside the wafers.

Although the embodiments of the present disclosure have been described in detail above, the scope of the present disclosure is not limited thereto, and various modifications and improvements can be made by those skilled in the art using the basic concept of the present disclosure defined in the following claims, and they fall within the scope of the present disclosure.

What is claimed is:

1. A substrate bonding apparatus comprising:

an upper chuck comprising a guide hole extending in a vertical direction;

a lower chuck below the upper chuck, wherein the upper chuck and the lower chuck are configured to have a plurality of overlapped substrates placed between the upper chuck and the lower chuck;

a striking pin configured to be driven within the guide hole and to strike the plurality of overlapped substrates; and a buffer member below and supporting the lower chuck, wherein the buffer member is configured to buffer a striking force transmitted by the striking pin.

2. The substrate bonding apparatus of claim 1, further comprising:

a stage upon which the lower chuck is placed, wherein the buffer member is between the lower chuck and the stage.

3. The substrate bonding apparatus of claim 2, wherein the buffer member vertically fills at least a portion of a space between the lower chuck and the stage.

4. The substrate bonding apparatus of claim 1, wherein the upper chuck comprises a downwardly convex portion, and wherein the guide hole penetrates the downwardly convex portion.

5. The substrate bonding apparatus of claim 4, wherein a center portion of the downwardly convex portion is thicker in the vertical direction than an edge portion of the downwardly convex portion.

6. The substrate bonding apparatus of claim 1, wherein a diameter of the buffer member in a horizontal direction is greater than a diameter of the guide hole in the horizontal direction and is smaller than a diameter of the plurality of overlapped substrates in the horizontal direction.

7. The substrate bonding apparatus of claim 6, wherein the diameter of the buffer member is within a range from 80 mm to 100 mm.

8. The substrate bonding apparatus of claim 1, wherein the buffer member comprises a material having a viscoelasticity within a range from 10 Pa·s to $10^8$ Pa·s.

9. The substrate bonding apparatus of claim 8, wherein the buffer member comprises a polymer material.

10. The substrate bonding apparatus of claim 1, wherein the buffer member contacts the lower chuck.

11. The substrate bonding apparatus of claim 1, wherein the lower chuck comprises an upwardly convex portion, and wherein the buffer member contacts the lower chuck below the upwardly convex portion.

12. The substrate bonding apparatus of claim 1, wherein the buffer member comprises any one selected from a group consisting of polyacrylamide, polyurethane, and polyimide (PI).

13. A substrate bonding apparatus comprising:

an upper chuck and a lower chuck facing each other and configured to have a plurality of overlapped substrates to be disposed therebetween;

a striking pin configured to be driven within a guide hole penetrating the upper chuck and to strike the plurality of overlapped substrates;

a stage upon which the lower chuck is placed; and a buffer member between the lower chuck and the stage, wherein the buffer member comprises a polymer material.

14. The substrate bonding apparatus of claim 13, wherein the buffer member comprises polyurethane.

15. The substrate bonding apparatus of claim 13, wherein the buffer member comprises a viscoelasticity within a range from 10 Pa·s to $10^8$ Pa·s.

16. The substrate bonding apparatus of claim 13, wherein the buffer member contacts the lower chuck and the stage.

17. The substrate bonding apparatus of claim 13, wherein a diameter of the buffer member in a horizontal direction is greater than a diameter of the striking pin in the horizontal direction, and is smaller than a diameter of the plurality of overlapped substrates in the horizontal direction.

18. The substrate bonding apparatus of claim 13, wherein a diameter of the buffer member in a horizontal direction is within a range from 80 mm to 100 mm.

19. The substrate bonding apparatus of claim 13, wherein the lower chuck comprises an upwardly convex portion, and wherein the upper chuck comprises a downwardly convex portion.

20. A substrate bonding apparatus comprising:

an upper chuck comprising:

a guide hole extending through the upper chuck in a vertical direction; and an upper suction hole extending through the upper chuck; and a lower chuck below the upper chuck, the lower chuck comprising:

a lower suction hole extending through the lower chuck;

a striking pin configured to be driven within the guide hole; and a buffer member below and supporting the lower chuck, wherein the upper chuck and the lower chuck are configured to have a plurality of overlapped substrates placed therebetween, wherein the upper suction hole and the lower suction hole are configured to apply suction to the plurality of overlapped substrates, wherein the striking pin is configured to strike the plurality of overlapped substrates, and wherein the buffer member is configured to buffer a striking force transmitted by the striking pin.

* * * * *